United States Patent
Jeon et al.

(10) Patent No.: US 10,651,249 B2
(45) Date of Patent: May 12, 2020

(54) ORGANIC LIGHT EMITTING DIODE DISPLAY DEVICE AND METHOD OF FABRICATING THE SAME

(71) Applicant: LG DISPLAY CO., LTD., Seoul (KR)

(72) Inventors: Hong-Myeong Jeon, Goyang-si (KR); Jae-Ki Lee, Paju-si (KR); Hwang-Un Seo, Paju-si (KR); A-Ryoung Lee, Seoul (KR); Geum-Young Lee, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/974,496

(22) Filed: May 8, 2018

(65) Prior Publication Data

US 2018/0254310 A1 Sep. 6, 2018

Related U.S. Application Data

(62) Division of application No. 13/972,221, filed on Aug. 21, 2013, now Pat. No. 9,991,321.

(30) Foreign Application Priority Data

Nov. 20, 2012 (KR) ........................ 10-2012-0131546

(51) Int. Cl.
*H01L 27/32* (2006.01)
*H01L 51/56* (2006.01)
*H01L 51/00* (2006.01)

(52) U.S. Cl.
CPC ........ *H01L 27/3246* (2013.01); *H01L 27/326* (2013.01); *H01L 27/3262* (2013.01);
(Continued)

(58) Field of Classification Search
CPC ............ H01L 27/3246; H01L 27/3283; H01L 27/3241–3279
See application file for complete search history.

(56) References Cited

U.S. PATENT DOCUMENTS 7,710,029 B2  5/2010  Yoshida et al.
2001/0025958 A1 * 10/2001  Yamazaki ........... G02F 1/13454
                                                257/72
(Continued)

FOREIGN PATENT DOCUMENTS

CN    1622706 A    6/2005
CN    1853926 A   11/2006
(Continued)

OTHER PUBLICATIONS

Chinese Office Action, dated Nov. 19, 2015, for corresponding Chinese Patent application No. 201310361963.X, 16 pages. (with English Translation).

*Primary Examiner* — Mariceli Santiago
(74) *Attorney, Agent, or Firm* — Seed IP Law Group LLP

(57) ABSTRACT

An organic light emitting diode display device includes a first substrate including a display region, wherein a plurality of pixel regions are defined in the display region; a first electrode over the substrate and in each of the plurality of pixel regions; a bank on edges of the first electrode and surrounding each of the plurality of pixel regions, the bank including a lower layer having a hydrophilic property and an upper layer having a hydrophobic property; an organic emitting layer on the first electrode and in each of the plurality of pixel regions surrounded by the bank; and a second electrode on the organic emitting layer and covering an entire surface of the display region.

67 Claims, 15 Drawing Sheets

(52) U.S. Cl.
CPC .......... *H01L 51/56* (2013.01); *H01L 27/3258* (2013.01); *H01L 51/0005* (2013.01)

(56) References Cited

U.S. PATENT DOCUMENTS

| | | | |
|---|---|---|---|
| 2002/0047514 A1* | 4/2002 | Sakurai | H01L 27/3246 313/503 |
| 2003/0052597 A1* | 3/2003 | Sakurai | H01L 27/3211 313/504 |
| 2004/0012870 A1* | 1/2004 | Nishikawa | H01L 51/524 359/883 |
| 2004/0224599 A1 | 11/2004 | Sakurada | |
| 2005/0014379 A1* | 1/2005 | Choi | H01L 27/3244 438/700 |
| 2005/0057152 A1* | 3/2005 | Park | H01L 27/3246 313/506 |
| 2005/0269962 A1* | 12/2005 | Matsunaga | H01L 27/3244 315/169.3 |
| 2007/0126343 A1* | 6/2007 | Lee | H01L 27/3246 313/503 |
| 2009/0001360 A1 | 1/2009 | Nakayama | |
| 2009/0026467 A1* | 1/2009 | Yanagihara | H01L 27/3246 257/88 |
| 2009/0284449 A1 | 11/2009 | Lee et al. | |
| 2009/0315450 A1 | 12/2009 | Kim et al. | |
| 2011/0180907 A1* | 7/2011 | McConnell | H01L 51/0012 257/618 |
| 2011/0221720 A1 | 9/2011 | Kuo et al. | |
| 2013/0038203 A1 | 2/2013 | Kim | |

FOREIGN PATENT DOCUMENTS

| | | |
|---|---|---|
| CN | 101139501 A | 3/2008 |
| JP | 10-233528 A | 9/1998 |
| JP | 2005-203419 A | 7/2005 |
| JP | 2007-094307 A | 4/2007 |
| KR | 10-0834344 B1 | 6/2008 |
| KR | 10-2011-0058824 A | 6/2011 |
| KR | 10-2011-0080587 A | 7/2011 |
| KR | 10-2012-0052851 A | 5/2012 |

\* cited by examiner heat treatment

ORGANIC LIGHT EMITTING DIODE DISPLAY DEVICE AND METHOD OF FABRICATING THE SAME

The present application claims the benefit of Korean Patent Application No. 10-2012-0131546 filed in Korea on Nov. 20, 2012, which is hereby incorporated by reference for all purposes as if fully set forth herein.

BACKGROUND

Field of the Disclosure

The disclosure relates to an organic light emitting diode (OLED) display device, which may be referred to as an organic electroluminescent display device, and more particularly, to an OLED display device having a bank of a double-layered structure and a method of fabricating the same.

Discussion of the Related Art

An OLED display device of new flat panel display devices has high brightness and low driving voltage. The OLED display device is a self-emitting type and has excellent view angle characteristics, contrast ratio, a response time, etc.

Accordingly, the OLED display device is widely used for a television, a monitor, a mobile phone, etc.

The OLED display device includes an array element and an organic light emitting diode. The array element includes a switching thin film transistor (TFT), which is connected to a gate line and a data line, a driving TFT, which is connected to the switching TFT, and a power line, which is connected to the driving TFT. The organic light emitting diode includes a first electrode, which is connected to the driving TFT, and further includes an organic emitting layer and a second electrode.

In the OLED display device, light from the organic emitting layer passes through the first electrode or the second electrode to display an image. A top emission type OLED display device, where the light passes through the second electrode, has an advantage in an aperture ratio.

Generally, the organic emitting layer is formed by a thermal deposition method using a shadow mask. However, the shadow mask sags because the shadow mask becomes larger with an increase in sizes of display devices. As a result, there is a problem in deposition uniformity in the larger display device. In addition, since a shadow effect is generated in the thermal deposition method using the shadow mask, it is very difficult to fabricate a high resolution OLED display device, e.g., above 250 PPI (pixels per inch).

Accordingly, a new method instead of the thermal deposition method using the shadow mask has been introduced.

In the new method, a liquid phase organic emitting material is sprayed or dropped in a region surrounded by a wall using an ink jet apparatus or a nozzle-coating apparatus and cured to form the organic emitting layer.

FIGS. 1A and 1B are schematic cross-sectional views showing an OLED display device in steps of forming an organic emitting layer by spraying or dropping a liquid phase organic emitting material.

To spray or drop the liquid phase organic emitting material by the ink jet apparatus or the nozzle-coating apparatus, a bank 53, which is formed on the first electrode 50 and surrounds a pixel region P, is required to prevent the liquid phase organic emitting material from flooding into a next pixel region P. Accordingly, as shown in FIG. 1A, the bank 53 is formed on edges of the first electrode 50 before forming the organic emitting layer 55.

The bank 53 is formed of an organic material including fluorine (F) such that the bank 53 has a hydrophobic property. The hydrophobic bank 53 prevents the organic emitting material, which has a hydrophilic property, from being formed on the bank 53 and flooding into the next pixel region P due to a mis-alignment of the ink jet apparatus or the nozzle-coating apparatus or an excessive amount of the organic emitting material.

The bank 53 may be formed by a mask process, which includes light-exposing and developing steps after the organic insulating material including fluorine is applied to an entire surface of the substrate 10.

Next, as shown in FIG. 1B, by spraying or dropping the liquid phase organic emitting material from a head of the ink-jet apparatus or a nozzle of the nozzle-coating apparatus into the pixel region P, which is surrounded by the bank 53, the pixel region P is filled with the organic emitting material. The organic emitting material is dried and cured by heat to form the organic emitting layer 55.

However, fluorine residues 54 may remain in the pixel region P when the bank 53 is formed, and the fluorine residues 54 may hinder the liquid phase organic emitting material from being spread in the pixel region P when the liquid phase organic emitting material is sprayed or dropped. Accordingly, as shown in FIG. 2, which is a picture showing a part of one pixel region in the related art OLED display device, the organic emitting layer is not formed around the hydrophobic bank, or a portion of the organic emitting layer around the hydrophobic bank has a thinner thickness than portions in other regions. Thus, dark images are displayed in edges of the pixel region. In addition, the OLED display device is degraded fast due to the difference in thicknesses, and the lifetime of the OLED display device is shortened.

SUMMARY

An organic light emitting diode display device includes a first substrate including a display region, wherein a plurality of pixel regions are defined in the display region; a first electrode over the substrate and in each of the plurality of pixel regions; a bank on edges of the first electrode and surrounding each of the plurality of pixel regions, the bank including a lower layer having a hydrophilic property and an upper layer having a hydrophobic property; an organic emitting layer on the first electrode and in each of the plurality of pixel regions surrounded by the bank; and a second electrode on the organic emitting layer and covering an entire surface of the display region.

In another aspect, a method of fabricating an organic light emitting diode display device includes forming a first electrode over a first substrate including a display region, which includes a plurality of pixel regions, the first electrode formed in each of the plurality of pixel regions; forming a bank on edges of the first electrode and surrounding each of the plurality of pixel regions, the bank including a lower layer having a hydrophilic property and an upper layer having a hydrophobic property; forming an organic emitting layer on the first electrode and in each of the plurality of pixel regions surrounded by the bank; and forming a second electrode on the organic emitting layer, the second electrode covering an entire surface of the display region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Reference will now be made in detail to the preferred embodiments, examples of which are illustrated in the accompanying drawings.

Figure 1A:
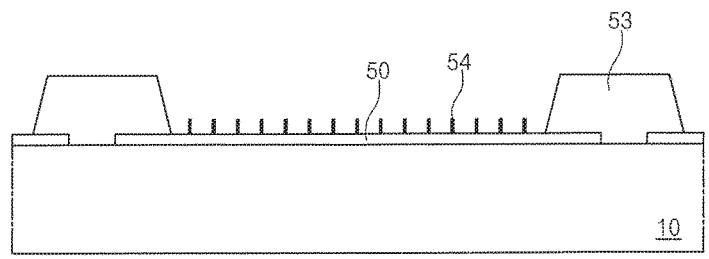
FIGS. 1A and 1B are schematic cross-sectional views showing an OLED display device in steps of forming an organic emitting layer by spraying or dropping a liquid phase organic emitting material.
Figure 1B:
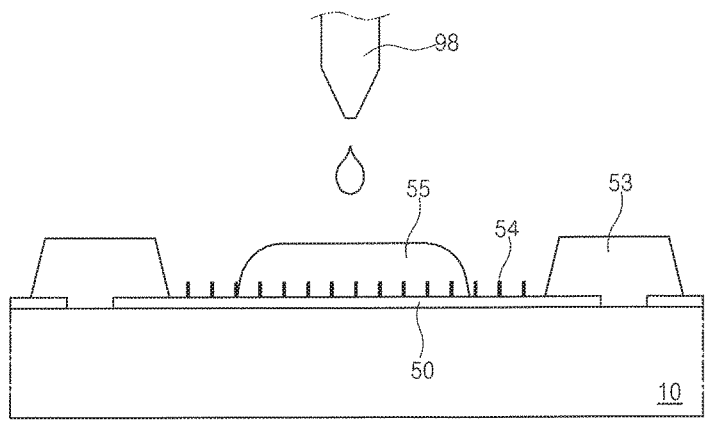
Figure 2:
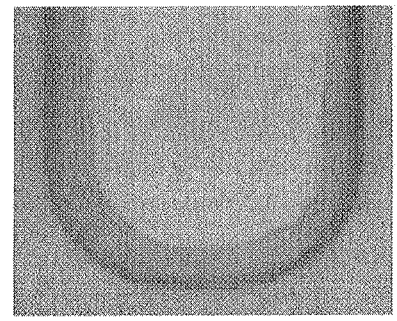
FIG. 2 is a picture showing a part of one pixel region in the related art OLED display device.
Figure 3:
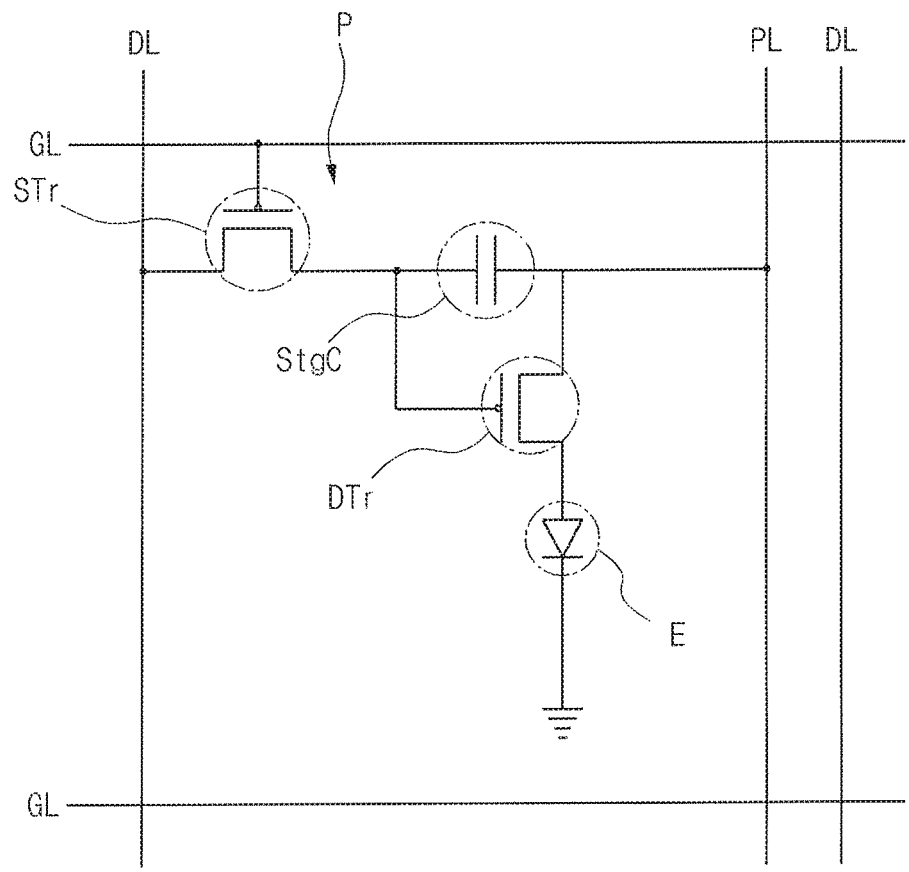
FIG. 3 is a circuit diagram of one pixel region of an OLED device.

FIG. 3 is a circuit diagram of one pixel region of an OLED device.

As shown in FIG. 3, an OLED display device includes a switching thin film transistor (TFT) STr, a driving TFT DTr, a storage capacitor StgC and an emitting diode E in each pixel region P.

On a substrate (not shown), a gate line GL along a first direction and a data line DL along a second direction are formed. The gate line GL and the data line DL cross each other to define the pixel region P. A power line PL for providing a source voltage to the emitting diode E is formed to be parallel to and spaced apart from the data line DL.

The switching TFT STr is connected to the gate and data lines GL and DL, and the driving TFT DTr and the storage capacitor StgC are connected to the switching TFT STr and the power line PL. The emitting diode E is connected to the driving TFT DTr.

A first electrode of the emitting diode E is connected to a drain electrode of the driving TFT DTr, and a second electrode of the emitting diode E is grounded.

When the switching TFT STr is turned on by a gate signal applied through the gate line GL, a data signal from the data line DL is applied to the gate electrode of the driving TFT DTr and an electrode of the storage capacitor StgC. When the driving TFT DTr is turned on by the data signal, an electric current is supplied to the emitting diode E from the power line PL. As a result, the emitting diode E emits light.

In this case, when the driving TFT DTr is turned on, a level of an electric current applied from the power line PL to the emitting diode E is determined such that the emitting diode E can produce a gray scale. The storage capacitor StgC serves to maintain the voltage of the gate electrode of the driving TFT DTr when the switching TFT STr is turned off. Accordingly, even if the switching TFT STr is turned off, a level of an electric current applied from the power line PL to the emitting diode E is maintained to a next frame.

Figure 4:
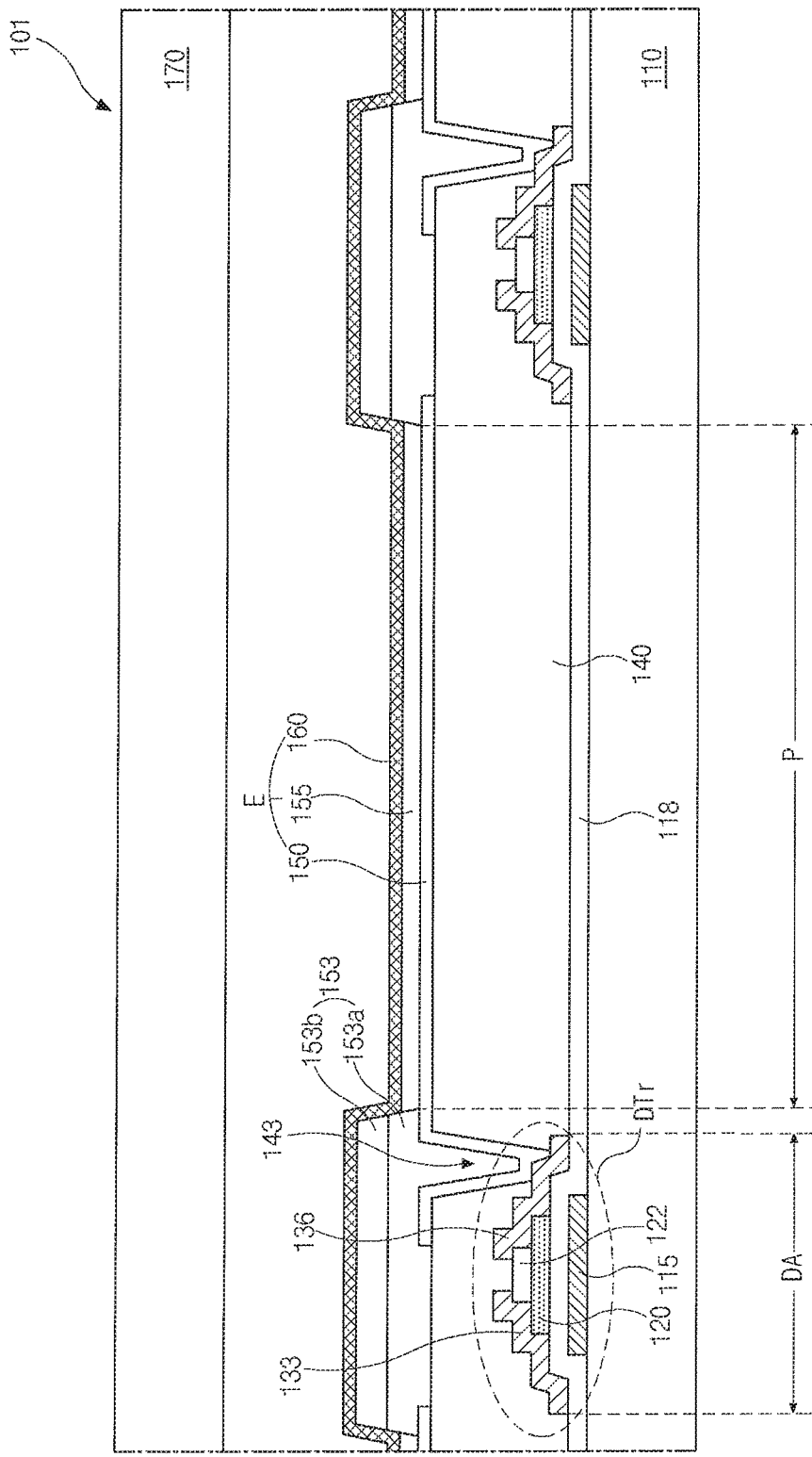
FIG. 4 is a schematic cross-sectional view of an OLED display device according to an embodiment of the present invention.

FIG. 4 is a schematic cross-sectional view of an OLED display device according to an embodiment of the present invention. For convenience of explanation, a driving area (DA) wherein a driving TFT DTr is formed, a pixel region P where an emitting diode E is formed, and a switching area (not shown) where a switching TFT (not shown) are defined.

As shown in FIG. 4, an OLED display device 101 of the present invention includes a first substrate 110, where the driving TFT DTr, the switching TFT (not shown) and the emitting diode E are formed, and a second substrate 170 for encapsulation. The second substrate 170 may be an inorganic insulating film or an organic insulating film.

A gate line (not shown) and a data line (not shown) are formed on the first substrate 110. The gate line and the data line cross each other to define the pixel region P. A power line (not shown) for providing a voltage to the emitting diode E is formed to be parallel to and spaced apart from the data line.

In each pixel region P, the switching TFT is connected to the gate line and the data line, and the driving TFT DTr and the storage capacitor StgC are connected to the switching TFT and the power line.

The driving TFT DTr includes a gate electrode 115, a gate insulating layer 118, an oxide semiconductor layer 120, an etch-stopper 122, a source electrode 133 and a drain electrode 136. The gate insulating layer 118 covers the gate electrode 115, and the oxide semiconductor layer 120 is disposed on the gate insulating layer 118. The oxide semiconductor layer 120 corresponds to the gate electrode 115. The etch-stopper 122 covers a center of the oxide semiconductor layer 120. The source electrode 133 and the drain electrode 136 are disposed on the etch-stopper 122 and spaced apart from each other. The source electrode 133 and the drain electrode 136 contact both ends of the oxide semiconductor layer 120, respectively. Although not shown, the switching TFT has substantially the same structure as the driving TFT DTr.

Figure 5:
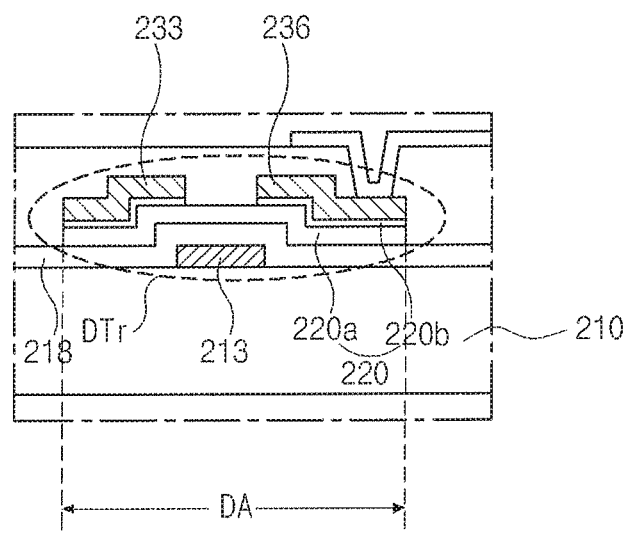
FIG. 5 is a schematic cross-sectional view of an OLED display device according to one modified embodiment of the present invention.

In FIG. 4, each of the driving TFT DTr and the switching TFT includes the oxide semiconductor layer 120 of an oxide semiconductor material. Alternatively, as shown in FIG. 5, each of the driving TFT DTr and the switching TFT may include a gate electrode 213, a gate insulating layer 218, a semiconductor layer 220 including an active layer 220a of intrinsic amorphous silicon and an ohmic contact layer 220b of impurity-doped amorphous silicon, a source electrode 233 and a drain electrode 236. In FIGS. 4 and 5, the driving TFT DTr has a bottom gate structure where the gate electrode 115 or 213 is positioned at a lowest layer.

Figure 6:
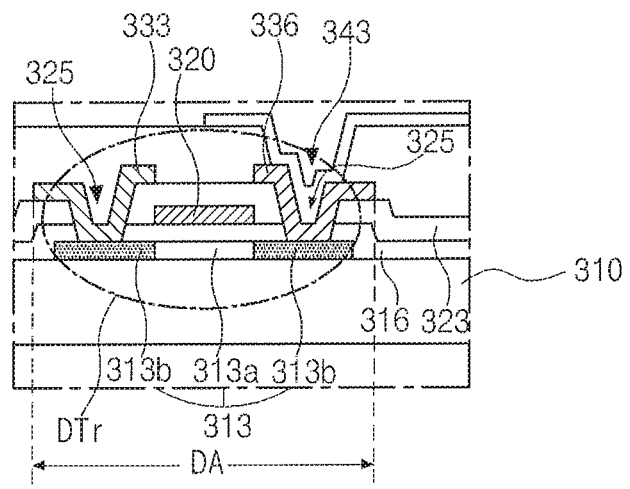
FIG. 6 is a schematic cross-sectional view of an OLED display device according to another modified embodiment of the present invention.

Meanwhile, each of the driving TFT DTr and the switching TFT may have a top gate structure where the semiconductor layer is positioned at a lowest layer. Namely, as shown in FIG. 6, each of the driving TFT DTr and the switching TFT may include a semiconductor layer 313, which includes an active region 313a of intrinsic polysilicon and impurity-doped regions 313b at both sides of the active region 313a, on a first substrate 310, a gate insulating layer 316, a gate electrode 320 corresponding to the active region 313a of the semiconductor layer 313, an interlayer insulating layer 323 having semiconductor contact holes 325, which expose the impurity-doped regions 313b of the semiconductor layer 313, and source and drain electrodes 333 and 336 respectively connected to the impurity-doped regions 313b through the semiconductor contact holes 325.

The top gate structure TFT requires the interlayer insulating layer 323 in comparison to the bottom gate structure TFT. In the top gate structure TFT, the gate line (not shown) is formed on the gate insulating layer 316, and the data line (not shown) is formed on the interlayer insulating layer 323.

Referring again to FIG. 4, a passivation layer 140, which includes a drain contact hole 143 exposing the drain electrode 136 of the driving TFT DTr, is formed over the driving TFT DTr and the switching TFT. For example, the passivation layer 140 may be formed of an organic insulating material, e.g., photo-acryl, to have a flat top surface.

A first electrode 150, which contacts the drain electrode 136 of the driving TFT DTr through the drain contact hole 143, is formed on the passivation layer 140 and separately in each pixel region P.

The first electrode 150 is formed of a conductive material having a relatively high work function, e.g., about 4.8 eV to 5.2 eV. For example, the first electrode 150 may be formed of a transparent conductive material such as indium-tin-oxide (ITO) to serve as an anode.

When the first electrode 150 is formed of the transparent conductive material, a reflection layer (not shown) may be formed under the first electrode 150 to increase emission efficiency in a top emission type OLED display device. For example, the reflection layer may be formed of a metallic material, such as aluminum (Al) or Al alloy such as AlNd, having a relatively high reflectivity.

With the reflection layer, the light from an organic emitting layer 155, which is formed on the first electrode 150, is reflected by the reflection layer such that the emission efficiency is increased. As a result, the OLED display device has an improved brightness property.

A bank 153 having a double-layered structure, which includes a lower layer 153a and an upper layer 153b, is formed on the first electrode 150 along boundaries of the pixel region P. The bank 153 overlaps edges of the first electrode 150 such that a center of the first electrode 150 is exposed by the bank 153.

The lower layer 153a of the bank 153 has a hydrophilic property, and the upper layer 153b has a hydrophobic property.

The organic emitting layer 155 is formed in each pixel region P surrounded by the bank 153 having the double-layered structure. The organic emitting layer 155 includes red, green and blue emitting materials in respective pixel regions P.

The organic emitting layer 155 is formed by forming an organic emitting material layer and curing the organic emitting material layer. The organic emitting material layer is formed by coating, i.e., spraying or dropping a liquid phase organic emitting material by an ink jet apparatus or a nozzle-coating apparatus.

In the OLED display device 101 including the bank 153 of a double-layered structure, which includes the lower layer 153a having the hydrophilic property and the upper layer 153b having the hydrophobic property, hydrophobic residues hardly remain on the first electrode 150 after patterning the bank 153, and the liquid phase organic emitting material can be spread well in the pixel region P surrounded by the bank 153 when the material is sprayed or dropped.

Furthermore, since force drawing the organic emitting material is generated due to the lower layer 153a having the hydrophobic property, the organic emitting material is spread better, and the organic emitting layer 155 is formed in edges of the pixel region P adjacent to the bank 153. Accordingly, the organic emitting layer 155 has a uniform thickness in the pixel region P due to the bank 153 having the double-layered structure.

FIG. 4 shows a single-layered organic emitting layer 155. Alternatively, to improve emission efficiency, the organic emitting layer 155 may have a multi-layered structure. For example, the organic emitting layer 155 may include a hole injecting layer, a hole transporting layer, an emitting material layer, an electron transporting layer and an electron injecting layer stacked on the first electrode 150 as an anode. The organic emitting layer 155 may be a quadruple-layered structure of a hole transporting layer, an emitting material layer, an electron transporting layer and an electron injecting layer or a triple-layered structure of a hole transporting layer, an emitting material layer and an electron transporting layer.

A second electrode 160 is formed on the organic emitting layer 155 and covers an entire surface of a display region of the first substrate 110. The second electrode 160 is formed of a metallic material having a relatively low work function, e.g., Al, Al alloy such as AlNd, silver (Ag), magnesium (Mg), gold (Au), or Al—Mg alloy (AlMg). The second electrode 160 serves as a cathode.

The first electrode 150, the organic emitting layer 155 and the second electrode 160 constitute the emitting diode E.

A seal pattern (not shown) of a sealant or a frit material is formed on edges of the first substrate 110 or the second substrate 170. The first and second substrates 110 and 170 are attached using the seal pattern. A space between the first and second substrates 110 and 170 has a vacuum condition or an inert gas condition. The second substrate 170 may be a flexible plastic substrate or a glass substrate.

Alternatively, the second substrate 170 may be a film contacting the second electrode 160. In this instance, the film-type second substrate is attached to the second electrode 160 by an adhesive layer.

In addition, an organic insulating film or an inorganic insulating film may be formed on the second electrode 160 as a capping layer. In this instance, the organic insulating film or the inorganic insulating film serves as the encapsulation film without the second substrate 170.

Hereinafter, a method of fabricating the OLED display device is explained with reference to drawings.

FIGS. 7A to 7H are cross-sectional views showing a fabricating process of an OLED display device according to an embodiment of the present invention. The explanation is focused on a bank having a double-layered structure.

Figure 7A:
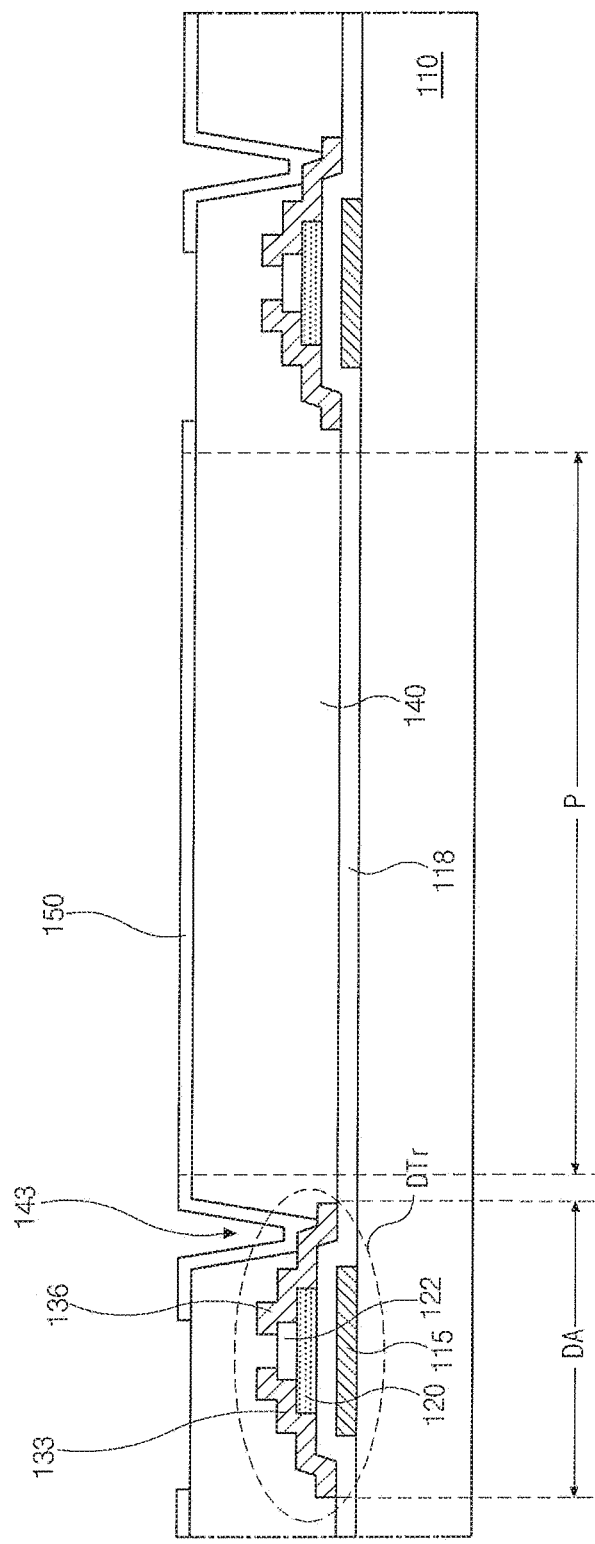
FIGS. 7A to 7H are cross-sectional views showing a fabricating process of an OLED display device according to an embodiment of the present invention.

As shown in FIG. 7A, the gate line (not shown), the data line (not shown) and the power line (not shown) are formed on the first substrate 110. In addition, the switching TFT (not shown) connected to the gate and data lines and the driving TFT DTr connected to the switching TFT and the power line are formed in the switching area (not shown) and in the driving area DA, respectively.

As explained above, each of the switching TFT and the driving TFT DTr has a bottom gate type TFT including the gate electrode 115 of FIG. 4 or 213 of FIG. 5 as a lowest layer or a top gate type TFT including the semiconductor layer 313 of FIG. 6 as a lowest layer. The bottom gate type TFT includes the oxide semiconductor layer 120 of FIG. 4 or the amorphous silicon semiconductor layer 220 of FIG. 5 including the active layer 220a and the ohmic contact layer 220b, and the top gate type TFT includes the poly-silicon semiconductor layer 313 of FIG. 6.

Here, the switching TFT and the driving TFT DTr may be the bottom gate type TFT including an oxide semiconductor layer. Therefore, the gate electrode 115 of the driving TFT DTr is formed on the first substrate 110, the gate insulating layer 118 is formed on the gate electrode 115, and the oxide semiconductor layer 120 is formed on the gate insulating layer 118 corresponding to the gate electrode 115. The etch-stopper 122 is formed on the oxide semiconductor layer 120 and covers the center of the oxide semiconductor layer 120. The source and drain electrodes 133 and 136 are formed on the etch-stopper 122 and spaced apart from each other.

Next, an organic insulating material, e.g., photo-acryl, is coated over the switching TFT and the driving TFT DTr and is patterned to form the passivation layer 140 having a flat top surface and including the drain contact hole 143. The drain electrode 136 of the driving TFT DTr is exposed through the drain contact hole 143.

Next, a transparent conductive material, which has a relatively high work function, is deposited on the passivation layer 140 and patterned to form the first electrode 150. The first electrode 150 contacts the drain electrode 136 of the driving TFT DTr through the drain contact hole 143 and is separated in each pixel region P. For example, the transparent conductive material may be indium tin oxide (ITO).

Meanwhile, as explained above, the reflection layer (not shown), which includes Al or Al alloy such as AlNd, may be formed under the first electrode 150 and on the passivation layer 140. The reflection layer may be formed by the same mask process as the first electrode 150.

Figure 7B:
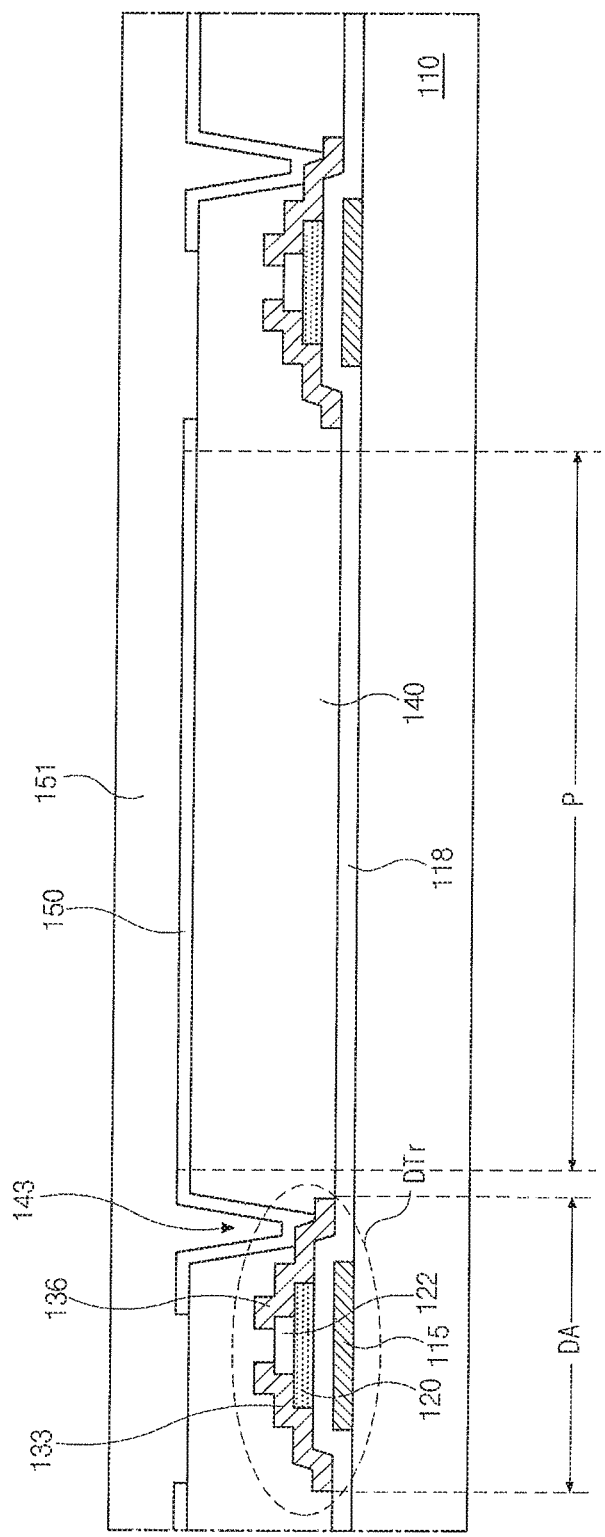

Next, as shown in FIG. 7B, a bank material layer 151 is formed on the first electrode 150 and the passivation layer 140. For example, the bank material layer 151 may be formed by applying a bank material with a coating apparatus such as a spin-coating apparatus, a bar-coating apparatus, or a slit-coating apparatus. The bank material may be a liquid phase and include a low molecular substance having a hydrophobic property and a high molecular substance having a hydrophilic property mixed at an optimal content ratio. The bank material may also have a photosensitive property and a phase separation property. For example, the low molecular substance may have a molecular weight of several tens to several thousand, more beneficially, more than 10 and under 10,000 and include fluorine (F). The high molecular substance may have a molecular weight of ten thousand to several million, more beneficially, more than 15,000 and less than 1,000,000. The high molecular substance may include a photosensitive polymer, for example, polyimide or acryl.

Figure 7C:
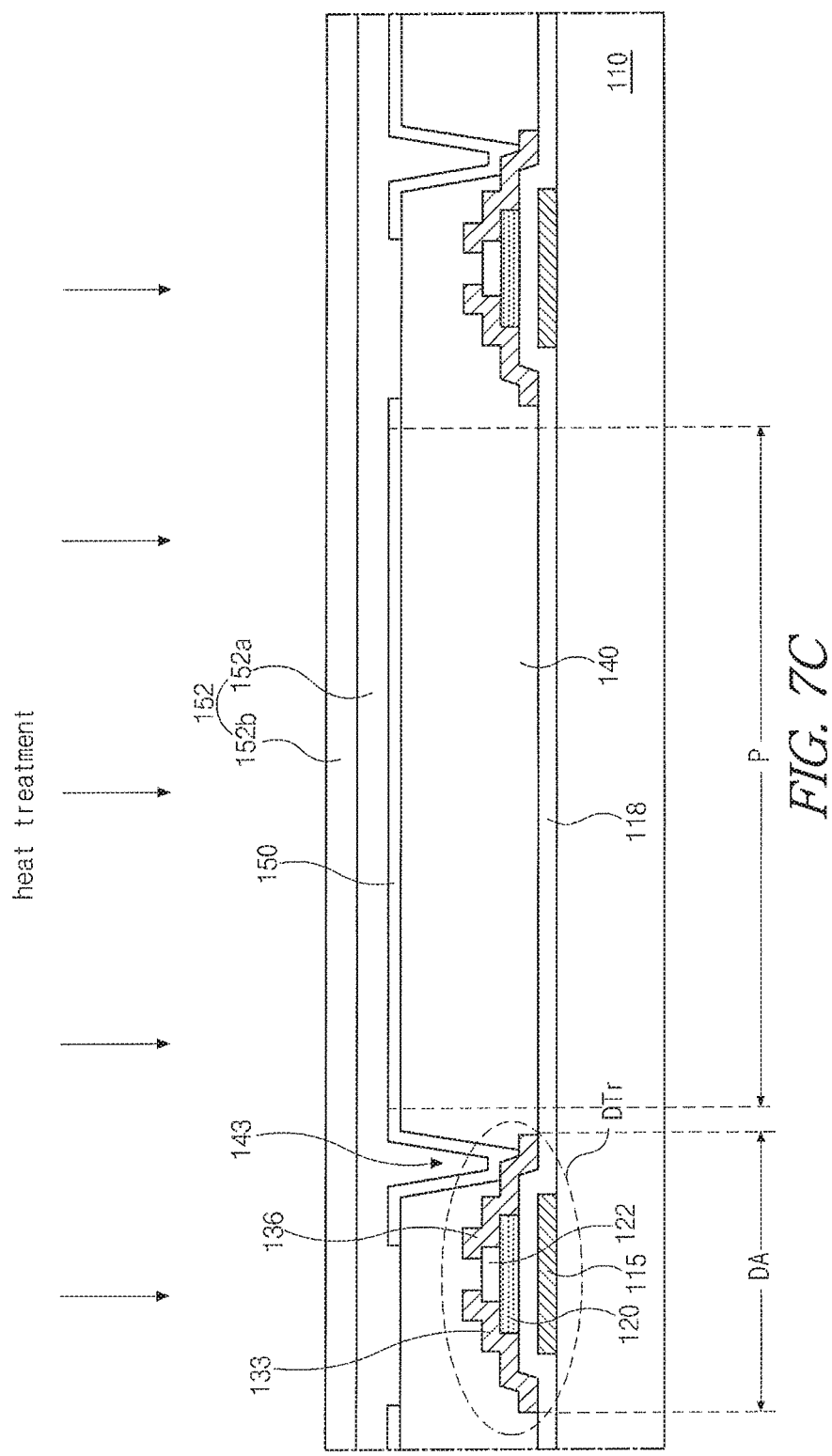

Next, in FIG. 7C, a heat-treatment process is performed to the bank material layer 151 of FIG. 7B. The heat-treatment process may be a soft-baking process. For example, the bank material layer 151 of FIG. 7B may be heat-treated in an oven or furnace having an inside temperature of 60 degrees of Celsius to 100 degrees of Celsius for several seconds to several hundred seconds or may be heat-treated on a hot plate having a surface temperature of 60 degrees of Celsius to 100 degrees of Celsius for several seconds to several hundred seconds.

The bank material layer 151 of FIG. 7B is dried and cured by heat through the soft-baking process, and molecules actively move due to the heat. Thus, phase separation occurs. More particularly, relatively heavy molecules having molecular weights of more than 15,000 move to a lower portion of the bank material layer 151 of FIG. 7B, and relatively light molecules having molecular weights under 10,000 move to an upper portion of the bank material layer 151 of FIG. 7B.

Meanwhile, solvents and moisture in the bank material layer 151 of FIG. 7B are removed by the heat during the soft-baking process, and the bank layer 152 having the double-layered structure, which includes a first layer 152a of a hydrophilic low molecular substance and a second layer 152b of a hydrophobic high molecular substance, is formed.

Figure 7D:
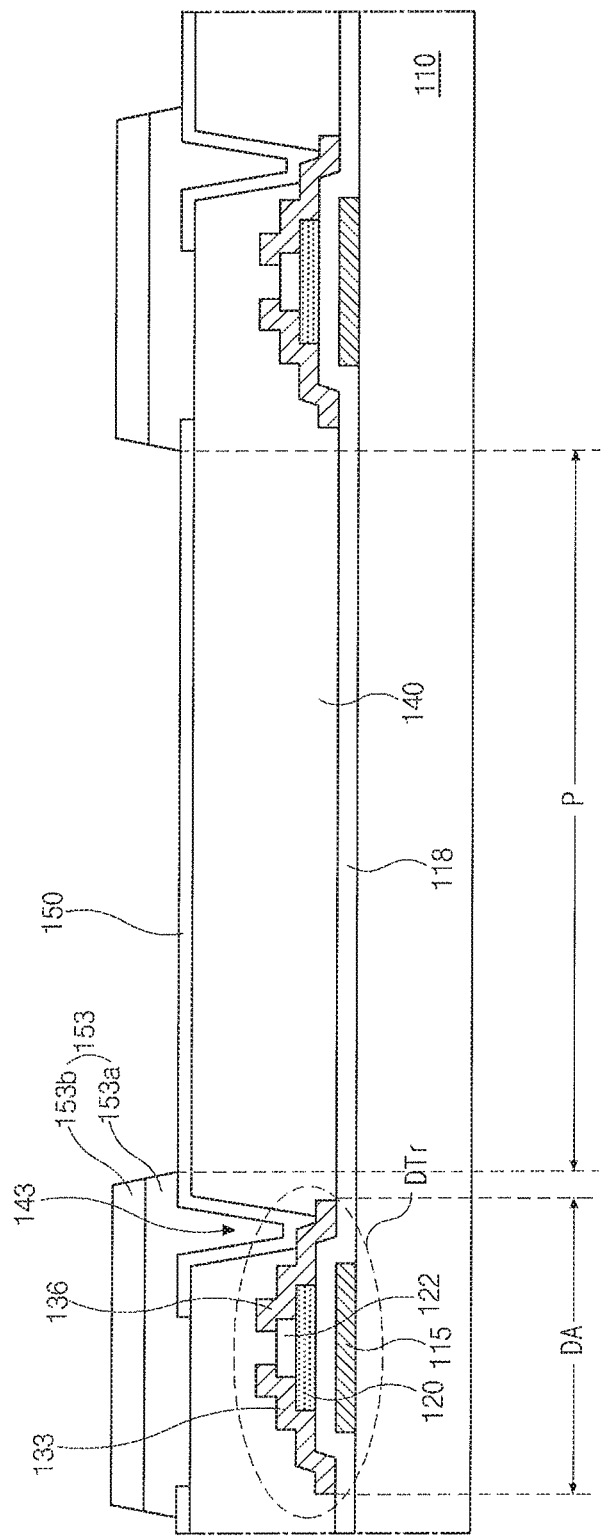

In FIG. 7D, an exposing mask (not shown) including a transmitting region and a blocking region is disposed over the bank material layer 152 of FIG. 7C, and an exposing process to the bank material layer 152 of FIG. 7C is performed using the exposing mask without an additional photoresist layer.

Here, the bank material layer 152 of FIG. 7C is shown to have a negative type photosensitive property where an exposed portion of the bank material layer 152 of FIG. 7C remains after a developing process. Alternatively, the bank material layer 152 of FIG. 7C may have a positive type photosensitive property, and at this time, a position of the transmitting region and the blocking region is switched.

Next, the bank 153 including the lower layer 153a and the upper layer 153b is formed by developing the bank layer 152 of FIG. 7C exposed to light. In this instance, an exposed portion of the bank layer 152 of FIG. 7C corresponding to the transmitting region of the exposing mask remains, and a non-exposed portion of the bank layer 152 of FIG. 7C corresponding to the blocking region of the exposing mask is removed by the developing process.

Here, the first layer 152a of the bank layer 152 of FIG. 7C contacting the first electrode 150 does not include fluorine (F), and the second layer 152b of the bank layer 152 of FIG. 7C including fluorine (F) does not contact the first electrode 150. Accordingly, after the developing process, fluorine residues may be completely removed or the minimum of fluorine residues may remain on the surface of the first electrode 150 even if the fluorine residues are not completely removed.

The bank 153 including the lower layer 153a and the upper layer 153b corresponds to the boundaries of the pixel region P and overlaps the edges of the first electrode 150. The lower layer 153a of the bank 153 has a hydrophilic property, and the upper layer 153b of the bank 153 has a hydrophobic property.

In the meantime, the bank 153 having the double-layered structure may be formed using a photosensitive material having a hydrophilic property and a photosensitive material having a hydrophobic property. This will be explained as another example of the embodiment with reference to FIGS. 8A to 8E. FIGS. 8A to 8E are cross-sectional views showing a fabricating process of on OLED display device according to another example of the embodiment of the present invention. In FIGS. 8A to 8E, the switching and driving TFTs and layers under the first electrode 150 are omitted, and figures show cross-sections of the OLED display device in steps of forming a bank having a double-layered structure.

Figure 8A:
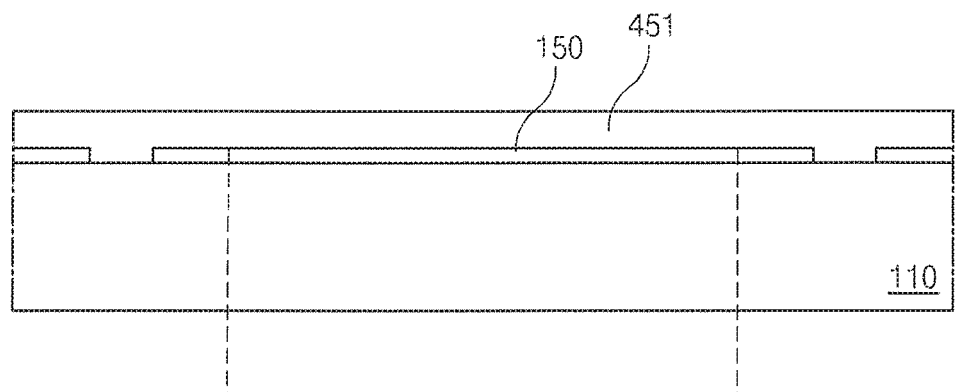
FIGS. 8A to 8E are cross-sectional views showing a fabricating process of on OLED display device according to another example of the embodiment of the present invention.

As shown in FIG. 8A, a first bank material layer 451 is formed on the first electrode 150 all over the first substrate 110. The first bank material layer 451 may be formed by applying a photosensitive material having a hydrophilic property, for example, polyimide or acryl, using a coating apparatus (not shown).

Figure 8B:
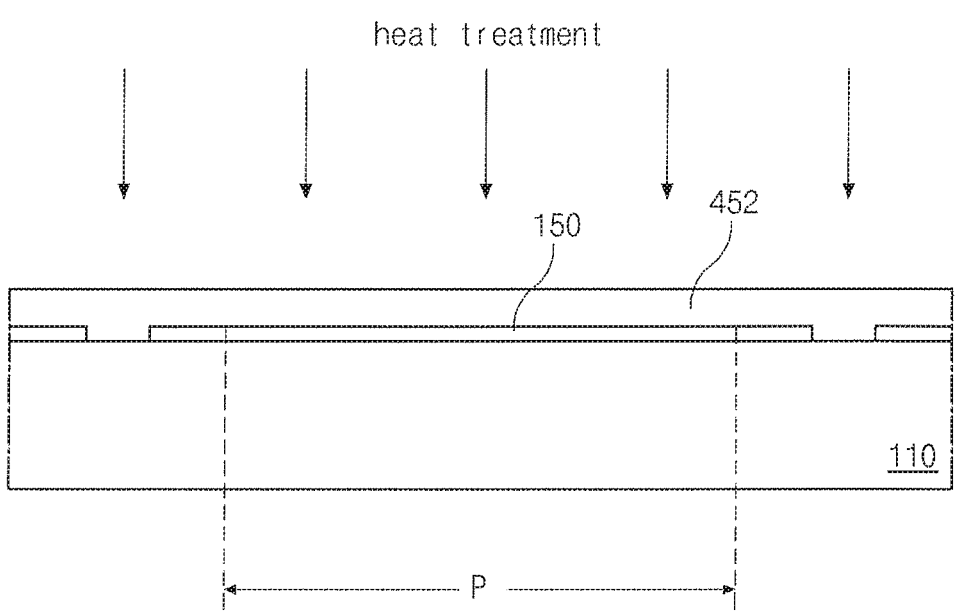

Next, in FIG. 8B, a first bank layer 452 having the hydrophilic property is formed by drying and curing the first bank material layer 451 of FIG. 8A through a heat-treatment process, for example, the soft-baking process as mentioned above.

The photosensitive material having the hydrophilic property may include a high molecular substance or a low molecular substance.

Figure 8C:
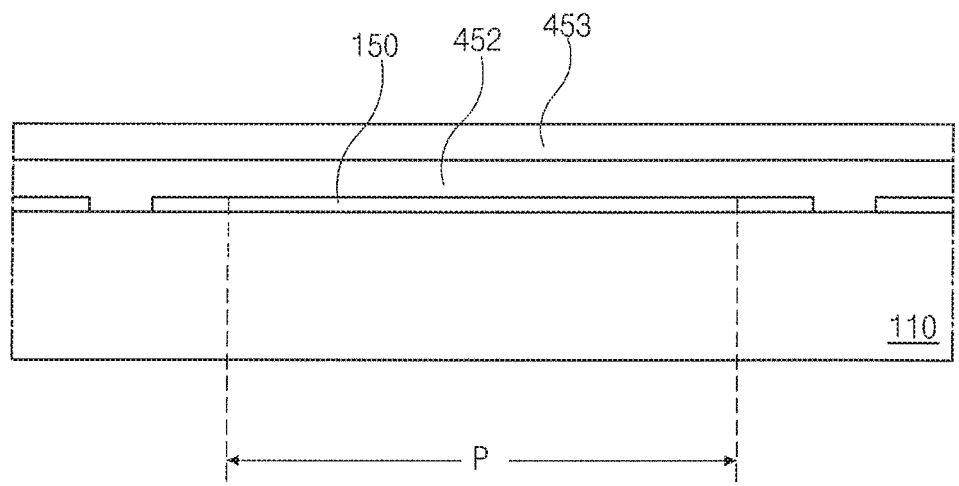

In FIG. 8C, a second bank material layer 453 is formed on the first bank layer 452. The second bank material layer 453 may be formed by applying a photosensitive material having a hydrophobic property, for example, acryl including fluorine (F), using a coating apparatus (not shown).

Figure 8D:
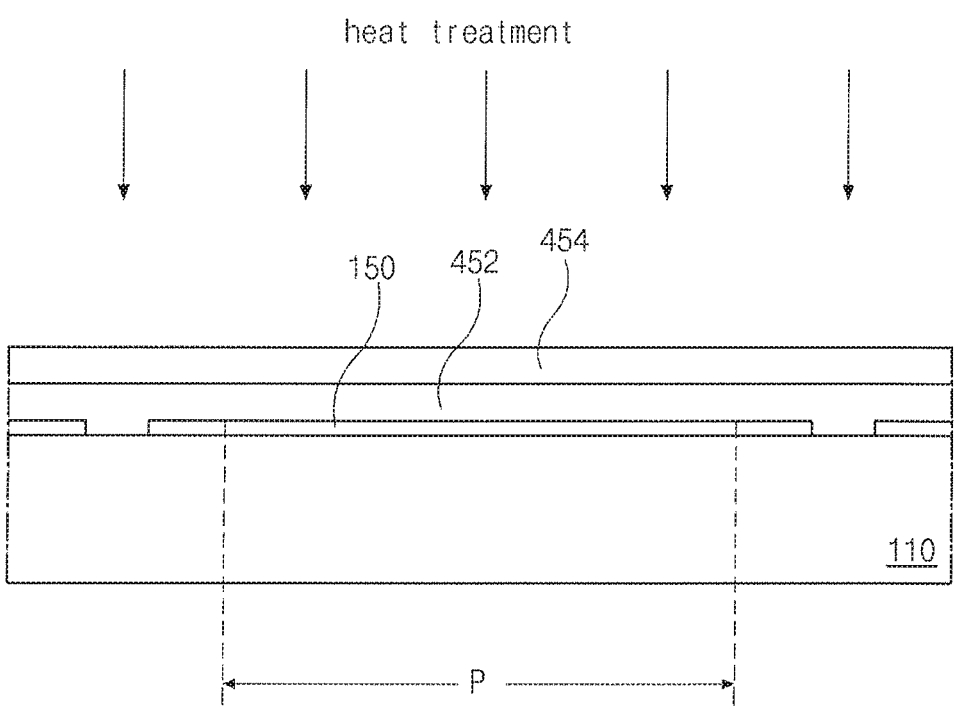

Next, in FIG. 8D, a second bank layer 454 having the hydrophobic property is formed by drying and curing the second bank material layer 453 of FIG. 8C through a heat-treatment process, for example, the soft-baking process as mentioned above. The photosensitive material having the hydrophobic property may include a high molecular substance or a low molecular substance.

Since the first bank layer 452 having the hydrophilic property is already cured, molecules of the photosensitive material having the hydrophobic property do not move into the first bank layer 452 during the soft-baking process of the second bank material layer 453 of FIG. 8C.

Figure 8E:
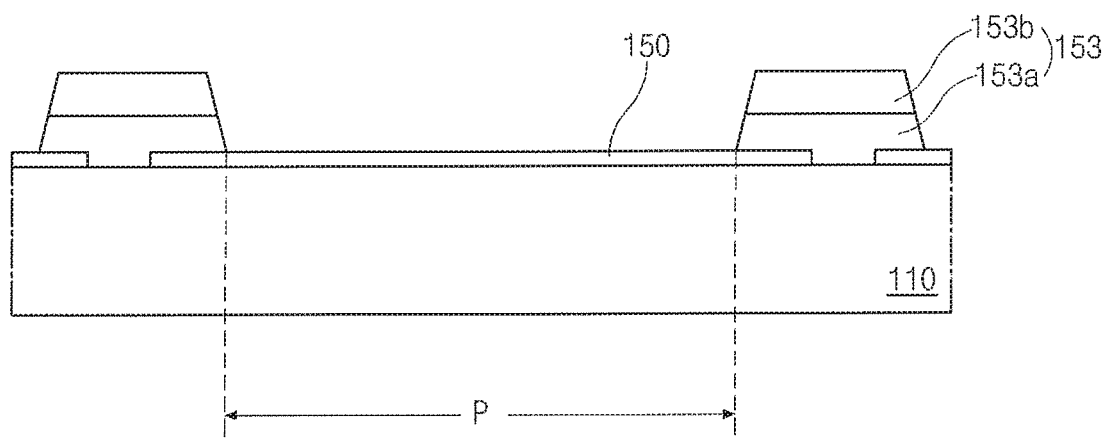

In FIG. 8E, the first and second bank layers 452 and 454 of FIG. 8D are exposed to light through an exposing mask (not shown) and developed, thereby forming the bank 153 having a double-layered structure of the hydrophilic lower layer 153a and the hydrophobic upper layer 153b, which is the same as that in FIG. 7D.

In another example of the embodiment of the present invention, there is no hydrophobic residue on the first electrode 150, and thus an organic emitting material, which will be sprayed or dropped, is spread well.

Figure 7E:
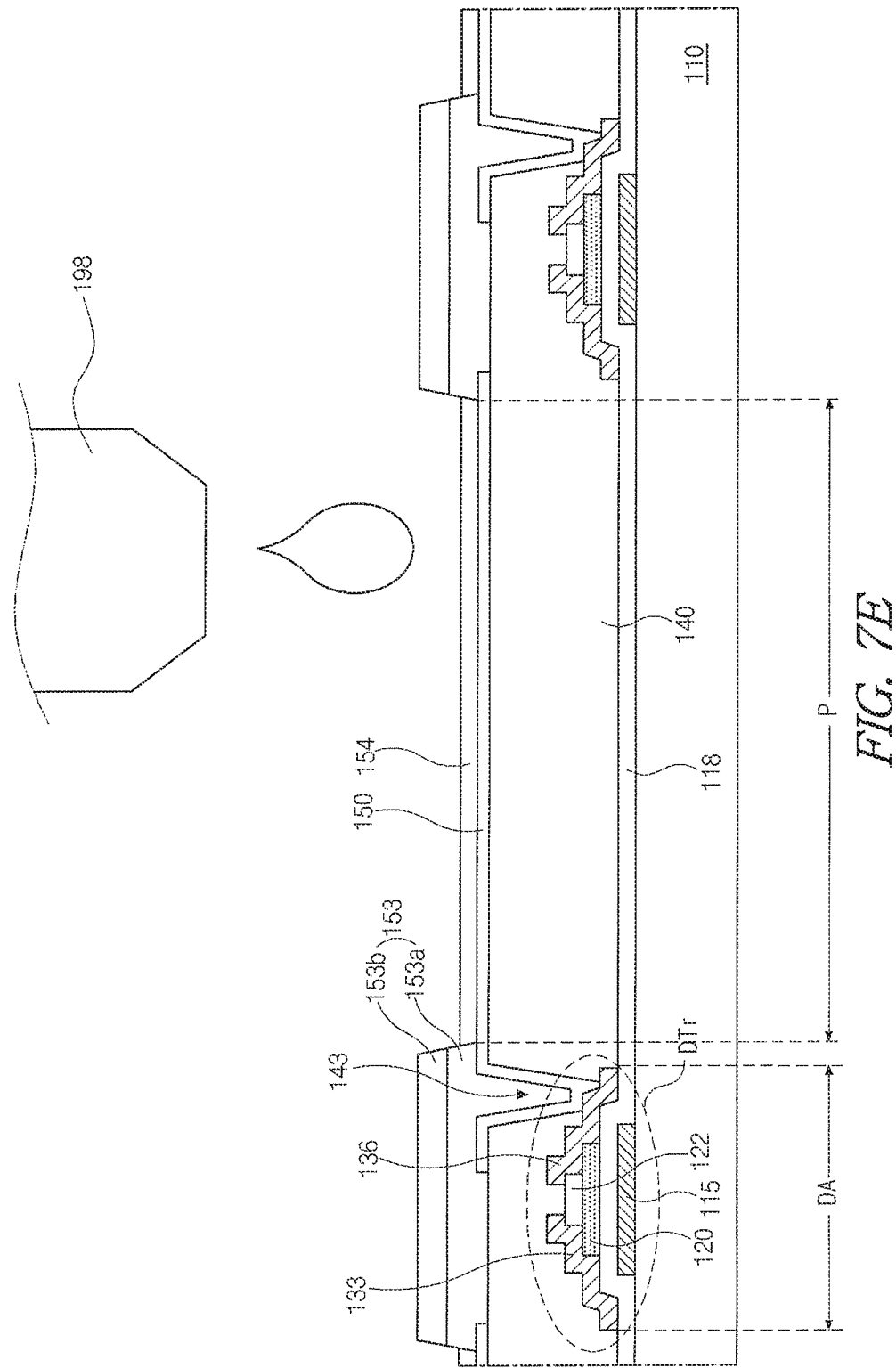

In the meantime, as shown in FIG. 7E, after forming the bank 153 having the double-layered structure, an organic emitting material layer 154 is formed on the first electrode 150 by spraying or dropping a liquid phase organic emitting material in a region surrounded by the bank 153, i.e., in the pixel region P, with an ink jet apparatus or a nozzle-coating apparatus 198.

Even if the organic emitting material is sprayed or dropped on the upper layer 153b because of a mis-alignment of the ink jet apparatus or the nozzle-coating apparatus 198, the organic emitting material is concentrated into a center of the pixel region P because the upper layer 153b has the hydrophobic property. In addition, even if an excessive amount of the organic emitting material is sprayed or dropped, the organic emitting material does not flow over the upper layer 153b due to the hydrophobic property of the upper layer 153b.

Furthermore, since the lower layer 153a of the bank 153 has the hydrophilic property, force drawing the liquid phase organic emitting material is generated from sides of the lower layer 153a of the bank 153, and the liquid phase organic emitting material is spread well on the first electrode 150 to contact the sides of the lower layer 153a of the bank 153.

Figure 7F:
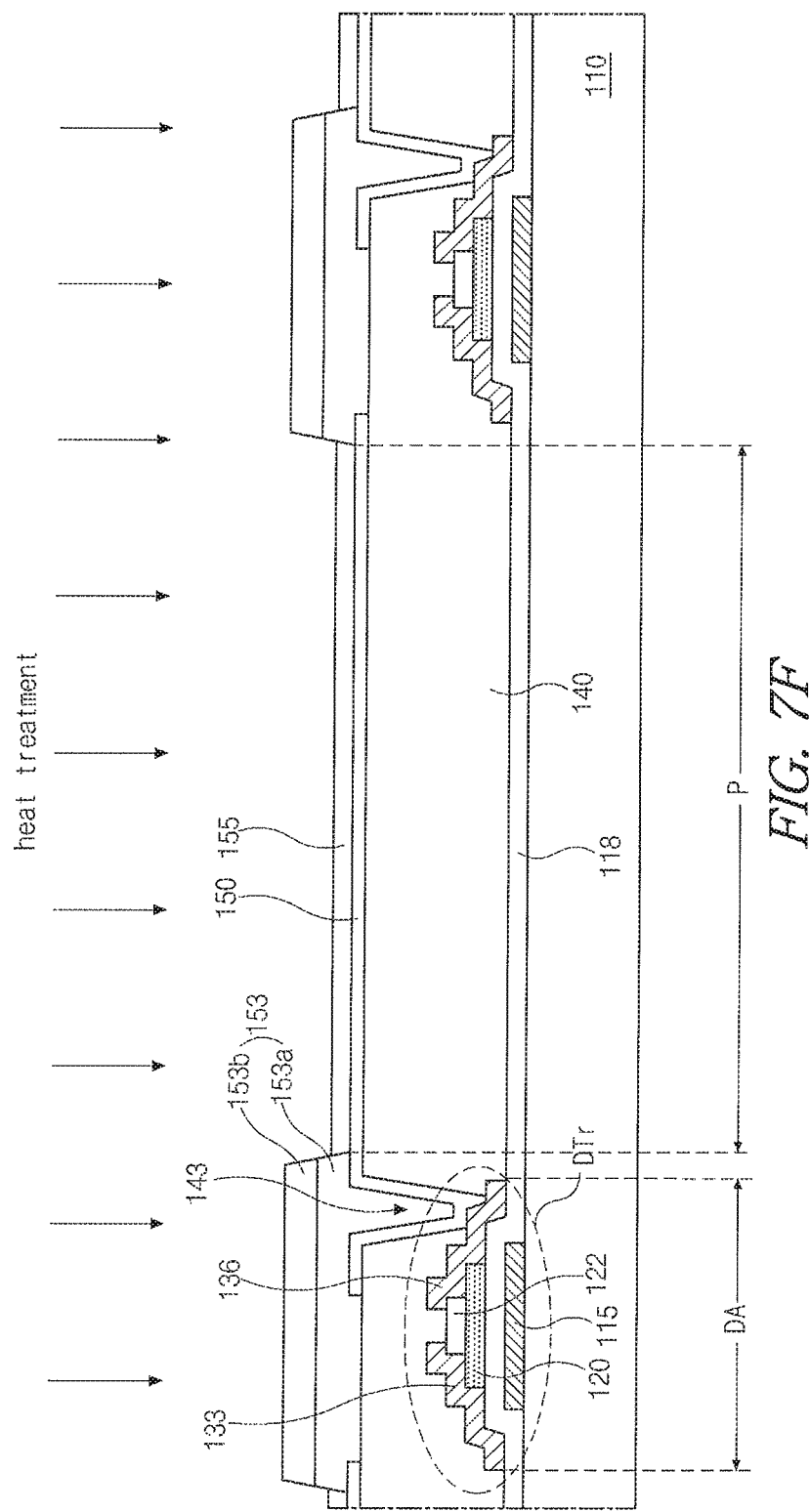

Next, as shown in FIG. 7F, by performing a curing process, solvents and moisture in the organic emitting material layer 154 of FIG. 7E are removed such that the organic emitting layer 155 is formed in the pixel region P.

As mentioned above, since the organic emitting layer 155 contacts the sides of the lower layer 153a of the bank 153, the organic emitting layer 155 is also formed around the bank 153 and has a substantially uniform thickness in the pixel region P.

Here, the organic emitting layer 155 has a single-layered structure. Alternatively, to improve emission efficiency, the organic emitting layer 155 may have a multi-layered structure, which may be formed by the same method as that of the single-layered structure or may be formed in an entire surface of a display region by a deposition method. For example, the organic emitting layer 155 may include a hole injecting layer, a hole transporting layer, an emitting material layer, an electron transporting layer and an electron injecting layer stacked on the first electrode 150 as an anode. The organic emitting layer 155 may be a quadruple-layered structure of the hole transporting layer, the emitting material layer, the electron transporting layer and an electron injecting layer or a triple-layered structure of the hole transporting layer, the emitting material layer and the electron transporting layer.

Figure 7G:
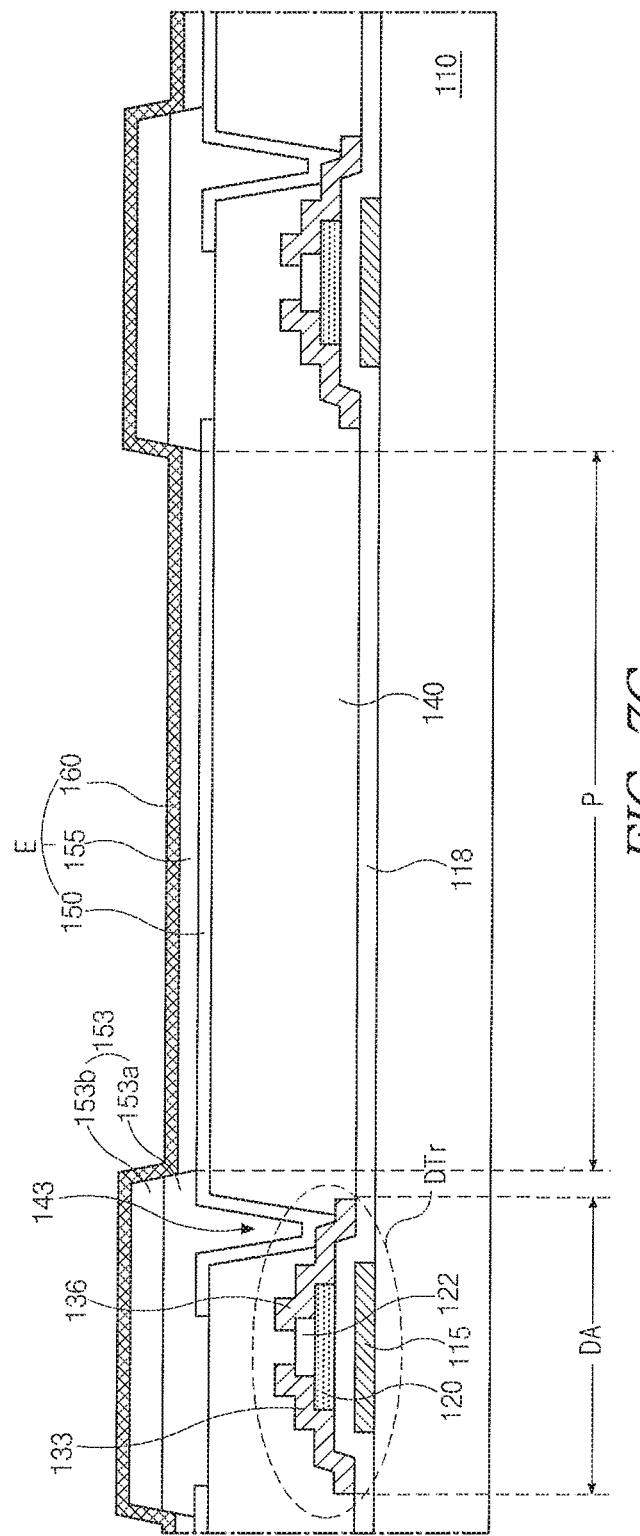

Next, as shown in FIG. 7G, the second electrode 160 is formed on the organic emitting layer 155 by depositing a metallic material having a relatively low work function. The second electrode 160 is formed on an entire surface of the display region. The metallic material includes at least one of Al, Al alloy such as AlNd, Ag, Mg, Au and AlMg.

As explained above, the first electrode 150, the organic emitting layer 155 and the second electrode 160 constitute the emitting diode E.

Figure 7H:
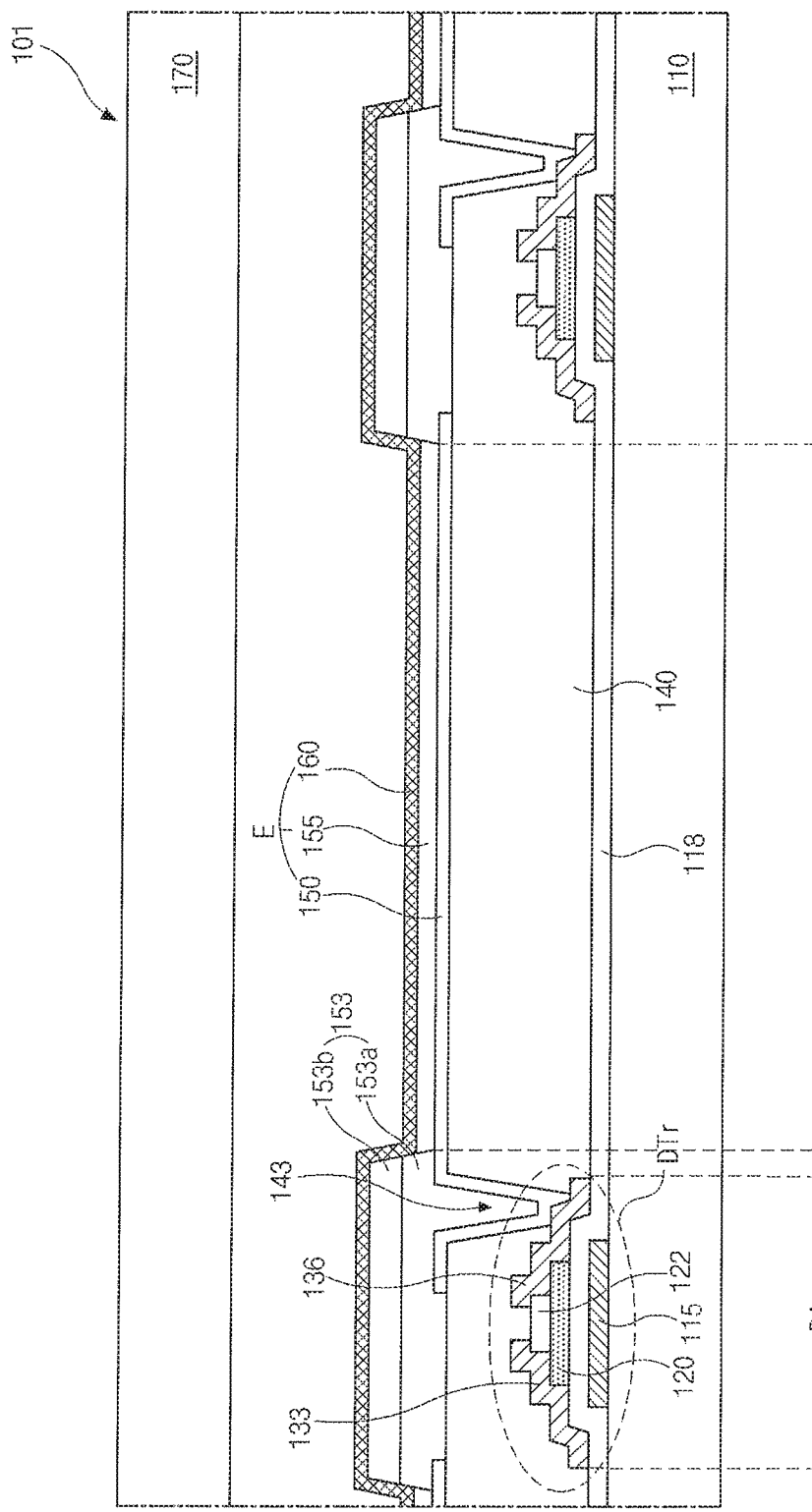

Next, as shown in FIG. 7H, after forming a seal pattern (not shown) on edges of the first substrate 110 or the second substrate 170, the first and second substrates 110 and 170 are attached under a vacuum condition or an inert gas condition such that the OLED display device is fabricated. Alternatively, a paste seal (not shown), which is formed of a fit material, an organic insulating material or a polymer material having transparent and adhesive properties is formed over an entire surface of the first substrate 110, and then the first and second substrates 110 and 170 are attached. As explained above, instead of the second substrate 170, an inorganic insulating film or an organic insulating film may be used for an encapsulation and may be attached by an adhesive layer.

In the OLED display device of the invention, since the bank has the double-layered structure of the hydrophilic lower layer and the hydrophobic upper layer, the hydrophobic residues hardly remain on the first electrode after forming the bank by patterning the bank layer. Therefore, the liquid phase organic emitting material is spread well in the pixel region surrounded by the bank when it is sprayed or dropped.

Moreover, the organic emitting material is spread better due to the force drawing the organic emitting material from the lower layer of the bank because the lower layer of the bank has the hydrophilic property, and the organic emitting layer is formed in the boundaries of the pixel region P adjacent to the bank.

Accordingly, the organic emitting layer has a uniform thickness in the pixel region, and the organic emitting layer is prevented from being degraded, thereby lengthening lifetime of the device.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display device, comprising:
   a first substrate including first and second pixel regions adjacent to each other;
   first and second thin film transistors on the first substrate, within respective first and second driving areas;

a passivation layer on the first and second thin film transistors;

first electrodes in the first and second pixel regions on the passivation layer and connected to the first and second thin film transistors, respectively, wherein the first electrode in the first pixel region is adjacent to the first electrode in the second pixel region and a portion of the passivation layer is exposed between the first electrodes in the first and second pixel regions; and respective first and second banks overlying the first and second driving areas, the first and second banks covering the exposed portion of the passivation layer and respective edges of the first electrodes in the first and second pixel regions, wherein the banks include a first portion having a first molecular weight and a second portion having a second molecular weight different from the first portion, and the second portion contacts the exposed portion of the passivation layer, wherein the second molecular weight is greater than the first molecular weight;

wherein the first portion is stacked on the second portion; and wherein the first electrode extending from the first driving area partially overlaps the second driving area.

2. The device according to claim 1, wherein the bank overlaps one of the first and second thin film transistors.

3. The device according to claim 1, wherein a side surface of the second portion has a same slope as a side surface of the first portion.

4. The device according to claim 1, wherein a thickness of the first portion is different from a thickness of the second portion.

5. The device according to claim 4, wherein the thickness of the first portion is larger than the thickness of the second portion.

6. The device according to claim 1, wherein the second portion includes a high molecular substance having a molecular weight of more than 15,000.

7. The device according to claim 6, wherein the first portion includes a low molecular substance having a molecular weight under 10,000.

8. The device according to claim 7, wherein the first portion and the second portion are formed through phase separation of a bank material including the high molecular substance and the low molecular substance.

9. The device according to claim 7, wherein the high molecular substance includes polyimide or acryl, and the low molecular substance includes fluorine.

10. The device according to claim 7, wherein the high molecular substance has a hydrophilic property and the low molecular substance has a hydrophobic property.

11. The device according to claim 1, wherein the first portion and the second portion are formed of a photosensitive material having a hydrophobic property and a photosensitive material having a hydrophilic property, respectively.

12. The device according to claim 11, wherein the photosensitive material having a hydrophobic property includes acryl including fluorine and the photosensitive material having a hydrophilic property includes polyimide or acryl.

13. The device according to claim 1, further comprising an organic emitting layer formed on the first electrode in each of the first and second pixel regions.

14. The device according to claim 13, wherein the organic emitting layer has a single-layered structure or a multi-layered structure.

15. The device according to claim 14, wherein the organic emitting layer has a triple-layered structure of a hole transporting layer, an emitting material layer and an electron transporting layer.

16. The device according to claim 14, wherein the organic emitting layer includes a hole injecting layer, a hole transporting layer, an emitting material layer, an electron transporting layer and an electron injecting layer.

17. The device according to claim 14, wherein at least one layer of the organic emitting layer is formed on the first electrode in each of the first and second pixel regions and is surrounded by the bank by spraying or dropping a liquid phase organic material.

18. The device according to claim 17, wherein at least one layer of the organic emitting layer is formed in an entire surface of a display region of the first substrate by a deposition method.

19. The device according to claim 13, wherein the organic emitting layer contacts a side of the second portion.

20. The device according to claim 13, further comprising a second electrode on the organic emitting layer and covering an entire surface of a display region of the first substrate.

21. The device according to claim 20, further comprising a second substrate for encapsulation and facing the first substrate.

22. The device according to claim 21, wherein the second substrate is a flexible plastic substrate or a glass substrate.

23. The device according to claim 21, wherein the second substrate is a film type and is attached to the second electrode by an adhesive layer.

24. The device according to claim 21, further comprising a seal of an organic insulating material or a polymer material formed over an entire surface of the first substrate, wherein the first and second substrates are attached with the seal interposed therebetween.

25. The device according to claim 21, further comprising a seal pattern of a sealant or a frit material on edges of the first substrate or the second substrate.

26. The device according to claim 20, further comprising a capping layer of an organic insulating film or an inorganic insulating film on the second electrode and serving as an encapsulation film.

27. The device according to claim 1, further comprising:
gate lines and data lines crossing each other to define the first and second pixel regions;
power lines parallel to the data lines; and
switching thin film transistors connected to the gate and data lines,
wherein the first and second thin film transistors are driving thin film transistors connected to the switching thin film transistors, respectively.

28. The device according to claim 27, wherein each of the switching thin film transistors and the driving thin film transistors includes an oxide semiconductor layer, an amorphous silicon semiconductor layer including an active layer and an ohmic contact layer, or a poly-silicon semiconductor layer.

29. The device according to claim 1, wherein the passivation layer is formed of photo-acryl and has a flat top surface.

30. The device according to claim 1, further comprising a reflection layer between each of the first electrodes and the passivation layer.

31. An organic light emitting diode display device, comprising:

a first substrate including first and second pixel regions adjacent to each other;

first and second thin film transistors on the first substrate, within respective first and second driving areas;

first electrodes in the first and second pixel regions and connected to the first and second thin film transistors, respectively, wherein the first electrode in the first pixel region overlaps the first thin film transistor and is adjacent to the first electrode in the second pixel region;

first and second banks on the first electrodes, respectively, wherein each of the first and second banks includes a first portion and a second portion having a different molecular weight from the first portion, a molecular weight of the second portion is greater than a molecular weight of the first portion, and the second portion is disposed between the first portion and each of the first electrodes, respective first and second banks overlying the first and second driving areas;

wherein a distance between the first and second banks is smaller than a distance between the first and second thin film transistors; and wherein the first electrode extending from the first driving area overlaps the second driving area.

32. The device according to claim 31, wherein the first electrodes in the first and second pixel regions are connected to drain electrodes of the first and second thin film transistors, respectively, and wherein the distance between the first and second banks is smaller than a distance between the drain electrode of the first thin film transistor and a source electrode or the drain electrode of the second thin film transistor.

33. The device according to claim 32, wherein each of the first and second thin film transistors further includes a gate electrode and an active layer.

34. The device according to claim 31, wherein the first and second banks overlap the first and second thin film transistors, respectively.

35. The device according to claim 31, wherein a side surface of the second portion has a same slope as a side surface of the first portion.

36. The device according to claim 31, wherein a thickness of the first portion is different from a thickness of the second portion.

37. The device according to claim 36, wherein the thickness of the first portion is larger than the thickness of the second portion.

38. The device according to claim 31, wherein the second portion includes a high molecular substance having a molecular weight of more than 15,000.

39. The device according to claim 38, wherein the first portion includes a low molecular substance having a molecular weight under 10,000.

40. The device according to claim 39, wherein the first portion and the second portion are formed through phase separation of a bank material including the high molecular substance and the low molecular substance.

41. The device according to claim 39, wherein the high molecular substance includes polyimide or acryl, and the low molecular substance includes fluorine.

42. The device according to claim 39, wherein the high molecular substance has a hydrophilic property and the low molecular substance has a hydrophobic property.

43. The device according to claim 31, wherein the first portion and the second portion are formed of a photosensitive material having a hydrophobic property and a photosensitive material having a hydrophilic property, respectively.

44. The device according to claim 43, wherein the photosensitive material having a hydrophobic property includes acryl including fluorine and the photosensitive material having a hydrophilic property includes polyimide or acryl.

45. The device according to claim 31, further comprising an organic emitting layer formed on the first electrode in each of the first and second pixel regions.

46. The device according to claim 45, wherein the organic emitting layer has a single-layered structure or a multi-layered structure.

47. The device according to claim 46, wherein the organic emitting layer has a triple-layered structure of a hole transporting layer, an emitting material layer and an electron transporting layer.

48. The device according to claim 46, wherein the organic emitting layer includes a hole injecting layer, a hole transporting layer, an emitting material layer, an electron transporting layer and an electron injecting layer.

49. The device according to claim 46, wherein at least one layer of the organic emitting layer is formed on the first electrode in each of the first and second pixel regions and is surrounded by the bank by spraying or dropping a liquid phase organic material.

50. The device according to claim 49, wherein at least one layer of the organic emitting layer is formed in an entire surface of a display region of the first substrate by a deposition method.

51. The device according to claim 45, wherein the organic emitting layer contacts a side of the second portion.

52. The device according to claim 45, further comprising a second electrode on the organic emitting layer and covering an entire surface of a display region of the first substrate.

53. The device according to claim 52, further comprising a second substrate for encapsulation and facing the first substrate.

54. The device according to claim 53, wherein the second substrate is a flexible plastic substrate or a glass substrate.

55. The device according to claim 53, wherein the second substrate is a film type and is attached to the second electrode by an adhesive layer.

56. The device according to claim 53, further comprising a seal of an organic insulating material or a polymer material formed over an entire surface of the first substrate, wherein the first and second substrates are attached with the seal interposed therebetween.

57. The device according to claim 53, further comprising a seal pattern of a sealant or a frit material on edges of the first substrate or the second substrate.

58. The device according to claim 52, further comprising a capping layer of an organic insulating film or an inorganic insulating film on the second electrode and serving as an encapsulation film.

59. The device according to claim 31, further comprising:
gate lines and data lines crossing each other to define the first and second pixel regions;
power lines parallel to the data lines; and
switching thin film transistors connected to the gate and data lines,
wherein the first and second thin film transistors are driving thin film transistors connected to the switching thin film transistors, respectively.

60. The device according to claim 59, wherein each of the switching thin film transistors and the driving thin film transistors includes an oxide semiconductor layer, an amorphous silicon semiconductor layer including an active layer and an ohmic contact layer, or a poly-silicon semiconductor layer.

61. The device according to claim 31, further comprising a passivation layer between the first and second thin film transistors and the first electrodes.

62. The device according to claim 61, wherein the passivation layer is formed of photo-acryl and has a flat top surface.

63. The device according to claim 61, further comprising a reflection layer between each of the first electrodes and the passivation layer.

64. An organic light emitting diode display device, comprising:
- a first substrate including first and second pixel regions adjacent to each other;
- first and second thin film transistors on the first substrate;
- a passivation layer on the first and second thin film transistors;
- first electrodes in the first and second pixel regions on the passivation layer and connected to the first and second thin film transistors, respectively, wherein the first electrode in the first pixel region is adjacent to the first electrode in the second pixel region and a portion of the passivation layer is exposed between the first electrodes in the first and second pixel regions; and
- a bank covering the exposed portion of the passivation layer and respective edges of the first electrodes in the first and second pixel regions, wherein the bank includes a first portion having a first molecular weight and a second portion having a second molecular weight different from the first portion, and the second portion contacts the exposed portion of the passivation layer;
- wherein the second molecular weight is greater than the first molecular weight; and
- wherein the first portion is stacked on the second portion, wherein the first electrode of the first pixel region is spaced apart from a gate electrode of the second thin film transistor of the second pixel region and overlaps a source electrode of the second thin film transistor of the second pixel region.

65. An organic light emitting diode display device, comprising:
- a first substrate including first and second pixel regions adjacent to each other;
- first and second thin film transistors on the first substrate;
- first electrodes in the first and second pixel regions and connected to the first and second thin film transistors, respectively, wherein the first electrode in the first pixel region overlaps the first thin film transistor and is adjacent to the first electrode in the second pixel region;
- first and second banks on the first electrodes, respectively, wherein each of the first and second banks includes a first portion and a second portion having a different molecular weight from the first portion, a molecular weight of the second portion is greater than a molecular weight of the first portion, and the second portion is disposed between the first portion and each of the first electrodes;
- wherein the first and second banks are disposed over the first and second thin film transistors, respectively, and a distance between the first and second banks is smaller than a distance between the first and second thin film transistors; and
- wherein the first electrode of the first pixel region is spaced apart from a gate electrode of the second thin film transistor of the second pixel region and overlaps a source electrode of the second thin film transistor of the second pixel region.

66. The device according to claim 1, wherein the first electrode in the first pixel region partially overlaps a gate electrode of the first thin film transistor.

67. The device according to claim 31, wherein the first electrode in the first pixel region partially overlaps a gate electrode of the first thin film transistor.

* * * * *